(12) United States Patent
Graham et al.

(10) Patent No.: US 10,183,857 B2
(45) Date of Patent: Jan. 22, 2019

(54) MEMS PRESSURE SENSOR WITH MULTIPLE MEMBRANE ELECTRODES

(71) Applicant: Robert Bosch GmbH, Stuttgart (DE)

(72) Inventors: Andrew Graham, Redwood City, CA (US); Ando Feyh, Palo Alto, CA (US); Bernhard Gehl, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 535 days.

(21) Appl. No.: 13/969,840

(22) Filed: Aug. 19, 2013

(65) Prior Publication Data

US 2014/0054731 A1    Feb. 27, 2014

Related U.S. Application Data

(60) Provisional application No. 61/691,472, filed on Aug. 21, 2012.

(51) Int. Cl.
| | | |
|---|---|---|
| *H01L 29/84* | (2006.01) | |
| *B81B 3/00* | (2006.01) | |
| *B81C 1/00* | (2006.01) | |
| *G01L 9/00* | (2006.01) | |
| *G01D 5/241* | (2006.01) | |

(52) U.S. Cl.
CPC ........ *B81B 3/0081* (2013.01); *B81C 1/00158* (2013.01); *G01L 9/0073* (2013.01); *G01D 5/2417* (2013.01)

(58) Field of Classification Search
CPC ....... B81B 3/00; B81B 3/0081; G01L 9/0073; B81C 1/00158; G01D 5/2417
See application file for complete search history.

(56) References Cited

U.S. PATENT DOCUMENTS

| | | |
|---|---|---|
| 3,952,234 A | 4/1976 | Birchall |
| 6,158,280 A | 12/2000 | Nonomura et al. |
| 6,664,126 B1 | 12/2003 | Devoe et al. |
| 6,675,656 B1 | 1/2004 | Plöchinger |
| 6,913,941 B2 | 7/2005 | O'Brien et al. |
| 7,056,757 B2 | 6/2006 | Ayazi et al. |
| 7,825,484 B2 | 11/2010 | Martin et al. |

(Continued)

FOREIGN PATENT DOCUMENTS

| | | |
|---|---|---|
| CN | 1252524 A | 5/2000 |
| JP | S6140529 A | 2/1986 |

(Continued)

OTHER PUBLICATIONS

International Search Report and Written Opinion corresponding to PCT Application No. PCT/US2013/055708, dated Dec. 2, 2013 (11 pages).

Candler et al., "Long-Term and Accelerated Life Testing of a Novel Single-Wafer Vacuum Encapsulation for MEMS Resonators," Journal of Microelectromechanical Systems, Dec. 2006, pp. 1446-1456, vol. 15, No. 6, IEEE, USA (11 pages).

(Continued)

*Primary Examiner* — Ismail A Muse
(74) *Attorney, Agent, or Firm* — Maginot Moore & Beck LLP (57) ABSTRACT

In one embodiment, a MEMS sensor includes a first fixed electrode in a first layer, a cavity defined above the first fixed electrode, a membrane extending over the cavity, a first movable electrode defined in the membrane and located substantially directly above the first fixed electrode, and a second movable electrode defined at least partially within the membrane and located at least partially directly above the cavity.

20 Claims, 6 Drawing Sheets

(56) References Cited

U.S. PATENT DOCUMENTS

| | | | |
|---|---|---|---|
| 8,027,143 B2* | 9/2011 | Rijks et al. | 361/281 |
| 2001/0038148 A1 | 11/2001 | Mastromatteo et al. | |
| 2002/0178828 A1* | 12/2002 | Suzuki et al. | 73/718 |
| 2003/0015040 A1 | 1/2003 | Ishio et al. | |
| 2008/0211302 A1* | 9/2008 | Hirota | B25J 13/02 307/1 |
| 2009/0127081 A1* | 5/2009 | Mikami et al. | 200/181 |
| 2010/0032775 A1 | 2/2010 | Morris, III et al. | |
| 2010/0295138 A1 | 11/2010 | Montanya Silvestre et al. | |
| 2011/0074248 A1* | 3/2011 | Hishinuma | 310/330 |
| 2012/0187211 A1* | 7/2012 | Nakamura | 239/102.2 |
| 2012/0261822 A1 | 10/2012 | Graham et al. | |
| 2013/0005277 A1* | 1/2013 | Klomsdorf et al. | 455/77 |

FOREIGN PATENT DOCUMENTS

| | | |
|---|---|---|
| JP | H06507723 A | 9/1994 |
| JP | 2002357498 A | 12/2002 |
| JP | 2003028740 A | 1/2003 |

OTHER PUBLICATIONS

Chen et al., "An Integrated Solution for Wafer-Level Packaging and Electrostatic Actuation of Out-Of-Plane Devices," Paper from Stanford University, 2009, pp. 1071-1074, IEEE, USA (4 pages).

Chen, "Electrode Integrated Wafer-Level Packaging for Out-of-Plane MEMS Devices," Abstract Preview, International Microelectronics and Packaging Society, 2009, USA (1 pages).

Hyldgård et al., "Fish & Chips: Single Chip Silicon MEMS CTDL Salinity, Temperature, Pressure and Light Sensor for Use in Fisheries Research," Sensors, 2005, IEEE, pp. 1124-1127 (4 pages).

Park et al., "Untraminiature encapsulated accelerometers as a fully implantable sensor for implantable hearing aids," Biomed Microdevices, 2007, Springer, USA (11 pages).

Web site publication, "Encapsulation for RF MEMS," http://micromachine.stanford.edu/~kuanlinc/Professional/Encapsulation%20for20%RF%20 . . . Downloaded Apr. 1, 2011, (4 pages).

English Translation of Chinese First Office Action Corresponding to Chinese Patent Application 201380054960.X (5 pages).

English Translation of Notice of Reasons for Rejection corresponding to Japanese Patent Application No. 2015-528569 (5 pages).

* cited by examiner

MEMS PRESSURE SENSOR WITH MULTIPLE MEMBRANE ELECTRODES

This application claims the benefit of U.S. Provisional Application No. 61/691,472 filed Aug. 21, 2012, the entire contents of which is herein incorporated by reference.

TECHNICAL FIELD

This disclosure relates to the field of MEMS devices.

BACKGROUND

MEMS sensors typically use a deformable membrane that deflects under applied pressure. For capacitive pressure sensors, an electrode on the membrane deflects toward a fixed electrode under increasing pressure leading to a change in the capacitance between the two electrodes. This capacitance is then measured to determine the pressure applied to the deformable membrane. Similarly, capacitive microphones respond to acoustic vibrations that cause a change in capacitance.

While the basic MEMS sensor described above is operable, the basic device structure does not provide sufficient accuracy needs in many applications. Accordingly, more complex structures have been investigated in hopes of providing the increased accuracy needs of various applications. While there has been some success in increasing the accuracy of MEMS sensors, significant challenges are encountered. Some of the challenges that are commonly encountered include: temperature sensitivity of the sensor; differences in temperature sensitivity of the variable capacitance (the membrane) and a reference capacitance (unaffected by pressure); the need for electrostatic actuation or additional measurement; and the limited measureable pressure range set by the geometry and material properties of the MEMS sensor structure.

In view of the foregoing, it would be beneficial to provide a MEMS pressure sensor which accounts for variations in temperature. It would be further beneficial if such a pressure sensor did not require significant additional space. A MEMS pressure sensor which accounts for variations in temperature which can be fabricated with known fabrication technology would be further beneficial. A pressure sensor which additionally provides an increased operational range would also be beneficial.

SUMMARY

In one embodiment, a MEMS sensor includes a first fixed electrode in a first layer, a cavity defined above the first fixed electrode, a membrane extending over the cavity, a first movable electrode defined in the membrane and located substantially directly above the first fixed electrode, and a second movable electrode defined at least partially within the membrane and located at least partially directly above the cavity.

In another embodiment, a method of forming a MEMS sensor includes forming a first fixed electrode in a first layer, forming a membrane layer above the first layer, forming a first movable electrode in the membrane layer and located substantially directly above the first fixed electrode, forming a second movable electrode in the membrane layer, and forming a cavity between the first layer and the membrane layer, the cavity extending beneath the first movable electrode and at least partially beneath the second movable electrode.

In yet another embodiment, a MEMS pressure system includes a MEMS sensor with a first fixed electrode in a first layer, a cavity defined above the first fixed electrode, a membrane extending over the cavity, a first movable electrode defined in the membrane and located substantially directly above the first fixed membrane, and a second movable electrode defined at least partially within the membrane and located at least partially directly above the cavity, a memory including program instructions stored therein; and a processor operably connected to the MEMS sensor and the memory and configured to execute the program instructions to obtain a first signal from the MEMS sensor using the first movable electrode, obtaining a second signal from the MEMS sensor using the second movable electrode and determine a pressure based upon the first signal and the second signal.

DESCRIPTION

For the purposes of promoting an understanding of the principles of the disclosure, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the disclosure as would normally occur to one skilled in the art to which this invention pertains.

Figure 1:
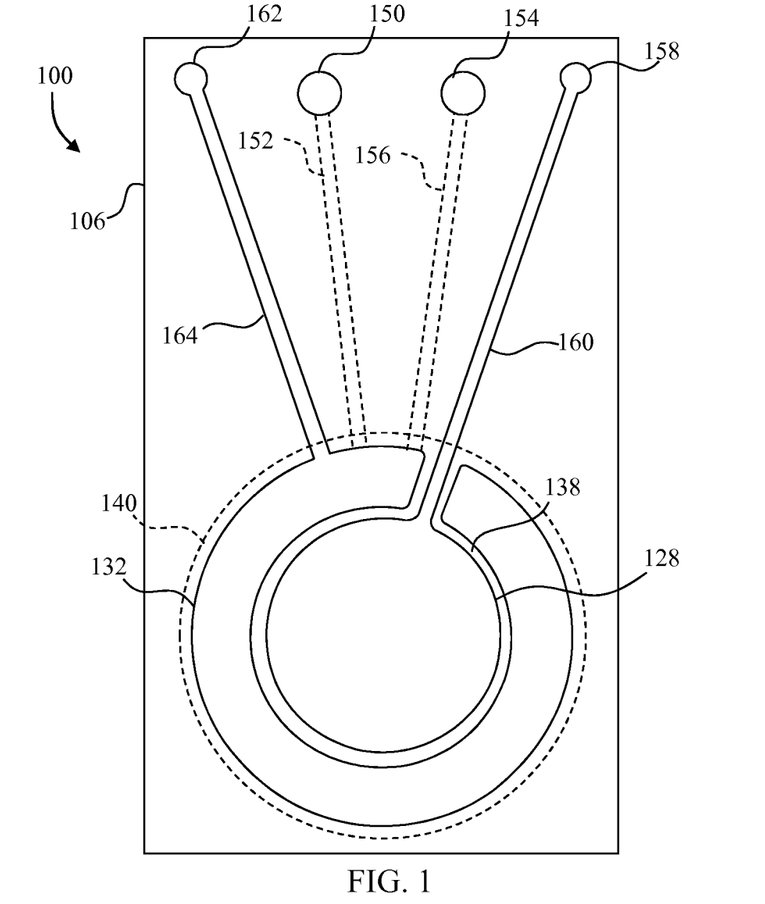
FIG. 1 depicts a top plan view of a sensor device including two movable electrodes in a membrane positioned above two fixed electrodes.
Figure 2:
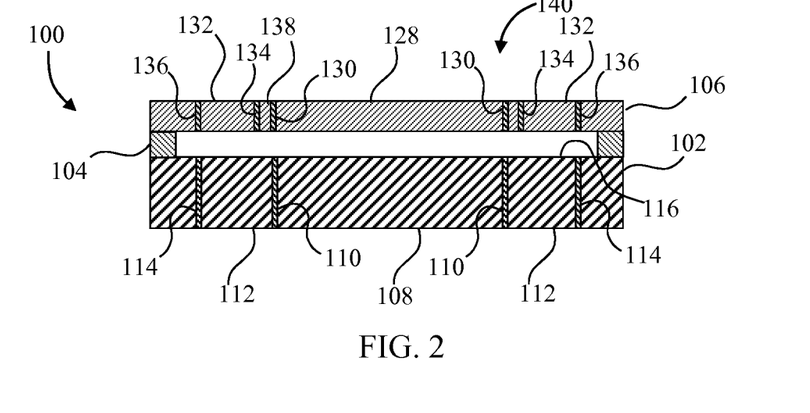
FIG. 2 depicts a side cross-sectional view of the sensor device of FIG. 1.

In many of these embodiments, a MEMS sensor may be used to sense a physical condition such as acoustic, light, acceleration, pressure, or temperature, and to provide an electrical signal representative of the sensed physical condition. For example, the MEMS sensor may be an accelerometer sensor, a motion sensor, a tilt sensor, a temperature sensor, a pressure sensor, an optical sensor, IR sensor, an acoustic sensor such as MEMS microphone, MEMS receiver/speaker), or a combination thereof. The embodiments may be implemented in or associated with a variety of applications such as automotives, home appliances, laptops, handheld or portable computers, mobile telephones, smart phones, wireless devices, tablets, personal data assistants (PDAs), MP3 players, camera, GPS receivers or navigation systems, electronic reading displays, projectors, cockpit controls, game consoles, earpieces, headsets, hearing aids, wearable display devices, security systems, and etc. FIGS. 1 and 2 depict a MEMS sensor 100. The MEMS sensor 100 is a capacitive pressure sensor and includes a device layer 102 and an oxide layer 104 which separates the device layer 102 from a cap layer 106.

Within the device layer 102, a generally circular fixed inner electrode 108 is defined by an electrical isolation portion 110. A fixed outer electrode 112 extends substantially completely about the fixed inner electrode 108. The outer electrode 112 is defined on its inner side by the isolation portion 110 and on its outer side by an isolation portion 114. Both the inner electrode 108 and the outer electrode 112 are separated from the cap layer 106 by a cavity 116.

Within the cap layer 106, a generally circular movable inner electrode 128 is defined by an electrical isolation portion 130. The inner electrode 128, which is substantially the same shape as the inner electrode 108, is substantially directly above the inner electrode 108. A movable outer electrode 132 extends substantially completely about the movable inner electrode 128. The outer electrode 132 is defined on its inner side by an isolation portion 134 and on its outer side by an isolation portion 136. An isolation ring 138, defined by the isolation portion 130 and the isolation portion 134, is located between the inner electrode 128 and the outer electrode 132. In some embodiments, a single isolation portion is the isolation ring. The outer electrode 132, which is substantially the same shape as the outer electrode 112, is substantially directly above the outer electrode 112. A membrane 140 is defined as the portion of the cap layer 106 located directly above a cavity 116. In one embodiment, the diameter of the flexible membrane 140 is larger than the diameter of the outer electrode 132. In another embodiment, the outermost electrode 132 extends beyond the edge of the membrane 140.

The inner electrode 108 is in electrical communication with a contact 150 through a lead line 152. The lead line 152, which may be formed in multiple steps, extends along the device layer 102 and upwardly through the oxide layer 104 to the upper surface of the cap layer 106 where the contact 150 is located. Similarly, the outer electrode 112 is in electrical communication with a contact 154 through a lead line 156 which extends along the device layer 102 and upwardly through the oxide layer 104 to the upper surface of the cap layer 106 where the contact 154 is located.

The inner electrode 128 is in electrical communication with a contact 158 through a lead line 160 which extends along the cap layer 106. The outer electrode 132 is in electrical communication with a contact 162 through a lead line 164 which extends along the cap layer 106.

Figure 3:
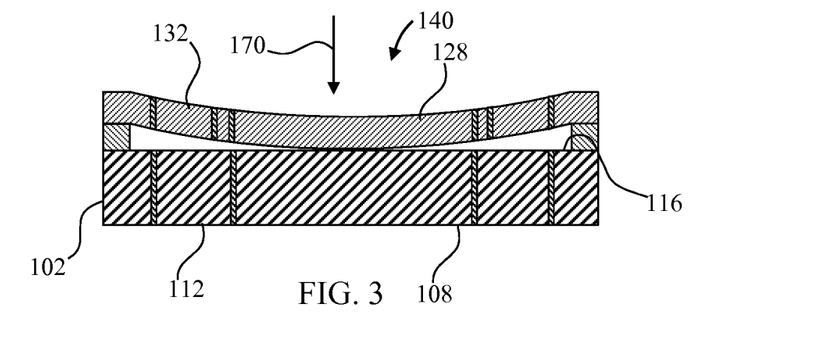
FIG. 3 depicts a side cross-sectional view of the sensor device of FIG. 1 with pressure applied to the flexible membrane so as to deform the flexible membrane.

In operation, pressure is applied to the flexible membrane 140 as indicated by the arrow 170 of FIG. 3. As pressure is applied, the flexible membrane 140 is forced into the cavity 116 toward the device layer 102. As the movable electrode 128 moves toward the fixed electrode 108, the capacitance between the movable electrode 128 and the fixed electrode 108 varies. This change is detectable by measuring the signal between the contacts 154 and 158.

During this initial movement of the inner electrode 128, the outer electrode 132 also moves, but by a significantly lesser amount because the outer electrode 132 is located by the outer edge of the membrane 140. Accordingly, the capacitance between the outer electrode 132 and the outer electrode 112, as measured at the contacts 154 and 162, is relatively unaffected by the initially applied pressure. Thus, the outer electrode 132 and the outer electrode 112 function as a reference capacitor and can be used to provide temperature compensation for the sensor device 100.

Moreover, in the configuration of FIG. 3, the membrane 140 is only slightly separated from the inner electrode 108. Accordingly, any sufficiently high pressure applied to the membrane 140 will force the upper movable electrode 128 into contact with the fixed electrode 108, thereby rendering the measurements across the contacts 150 and 158 invalid. In previously known devices, this represents the operational limit of a sensor.

Even as the movable electrode 128 contacts the fixed electrode 108, however, the outer electrode 132 is spaced apart from the outer electrode 112. Accordingly, the outer electrode 132 and the outer electrode 112 provide additional range for measuring pressure applied to the membrane 140 since additional pressure results in further deformation of the membrane 140 from the configuration of FIG. 3, thereby varying the capacitance measured across the contacts 150 and 162. Thus, even when the inner electrode pair 108/128 is limited by excessive output non-linearity or some other sensor limitation, the sensor 100 provides useful output.

Figure 4:
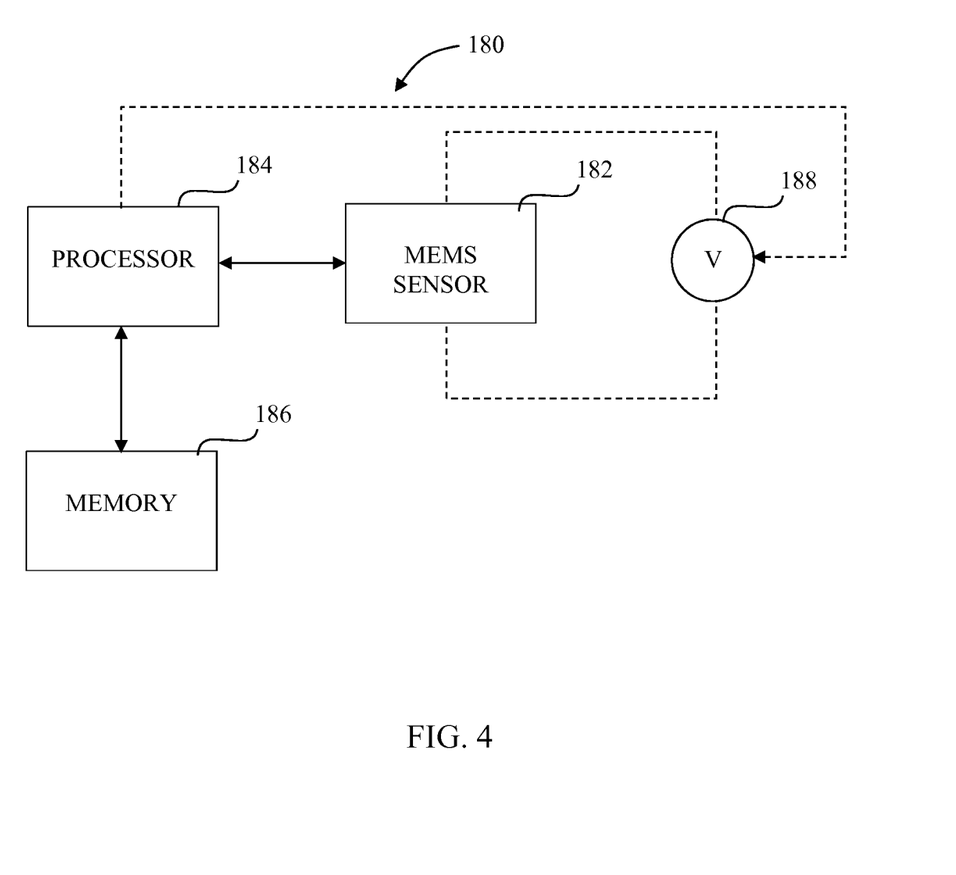
FIG. 4 depicts a schematic view of a system which provides for monitoring of two different pressure regimes using a sensor with at least two movable electrodes in a single membrane.

A system 180 which incorporates a sensor 182 including at least two movable electrodes in a membrane is depicted in FIG. 4. The system 180 further includes a processor 184, a memory 186, and optionally, a controllable voltage source 188. The memory 186 includes program instructions which, when executed by the processor 184, processes at least two signals from the sensor 182. One signal is based upon a first movable electrode in a membrane such as the movable electrode 128 of FIG. 2, and the second signal is based upon a second movable electrode in the membrane such as the electrode 132. These signals may be processed as described above to provide for a low-pressure regime sensitivity with an inner electrode and a high-pressure regime sensitivity with an outer electrode.

Though it is possible to use a single pair of electrodes to simultaneously apply a voltage to the structure and measure the capacitance, such a measurement is more susceptible to noise and other measurement error sources. By including additional electrode pairs, a different set of electrodes can be used to apply the voltage while measuring on the original electrode pair with sufficient electrical isolation so as to not influence the measurement for either modulating the pressure measurement signal or in order to apply a self-test signal. Accordingly, in the embodiment of FIG. 5, a portion of a sensor 200 is shown which includes multiple inner electrodes 202 and multiple outer electrodes 204 provided in a flexible membrane 206. The sensor 200 includes respective fixed electrodes (not shown) for each of the multiple inner electrodes 202 and multiple outer electrodes 204. By incorporating the sensor 200 as the sensor 182 of FIG. 4, the processor 184 can execute program instructions in the memory 186 to control the voltage source 188 to modulate the pressure measurement signal or in order to apply a self-test signal.

Figures 5, 6:
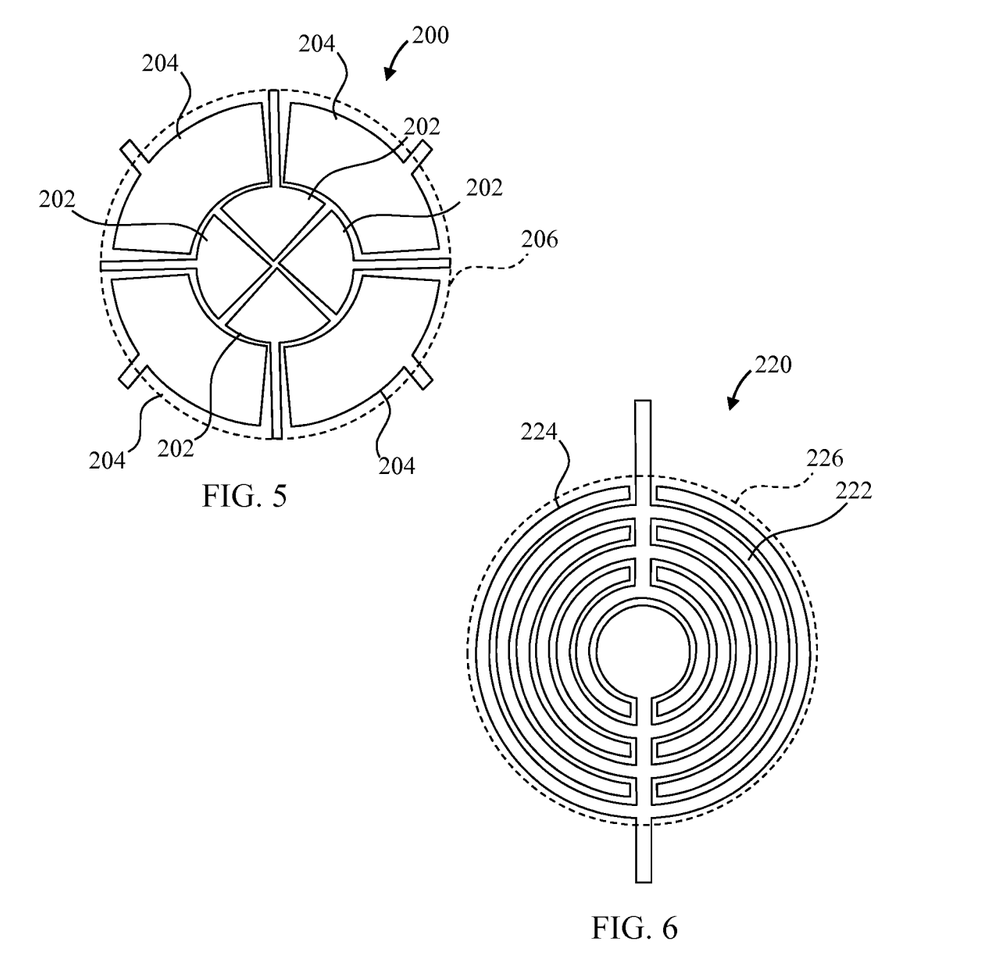
FIG. 5 depicts a top plan view of the membrane portion of a sensor device including multiple inner electrodes and multiple outer electrodes in the flexible membrane.
FIG. 6 depicts a top plan view of the membrane portion of a sensor device including two interdigitated electrodes in the flexible membrane.

In embodiments where it is not desired to have pairs of "inner" and "outer" electrodes, the electrodes may be interdigitated. By way of example, FIG. 6 depicts a portion of a sensor 220 that includes interdigitated electrodes 222 and 224 in a flexible membrane 226. The electrode 224 is located at both the center of the membrane 226 and the outer portion of the membrane 226.

Figure 7:
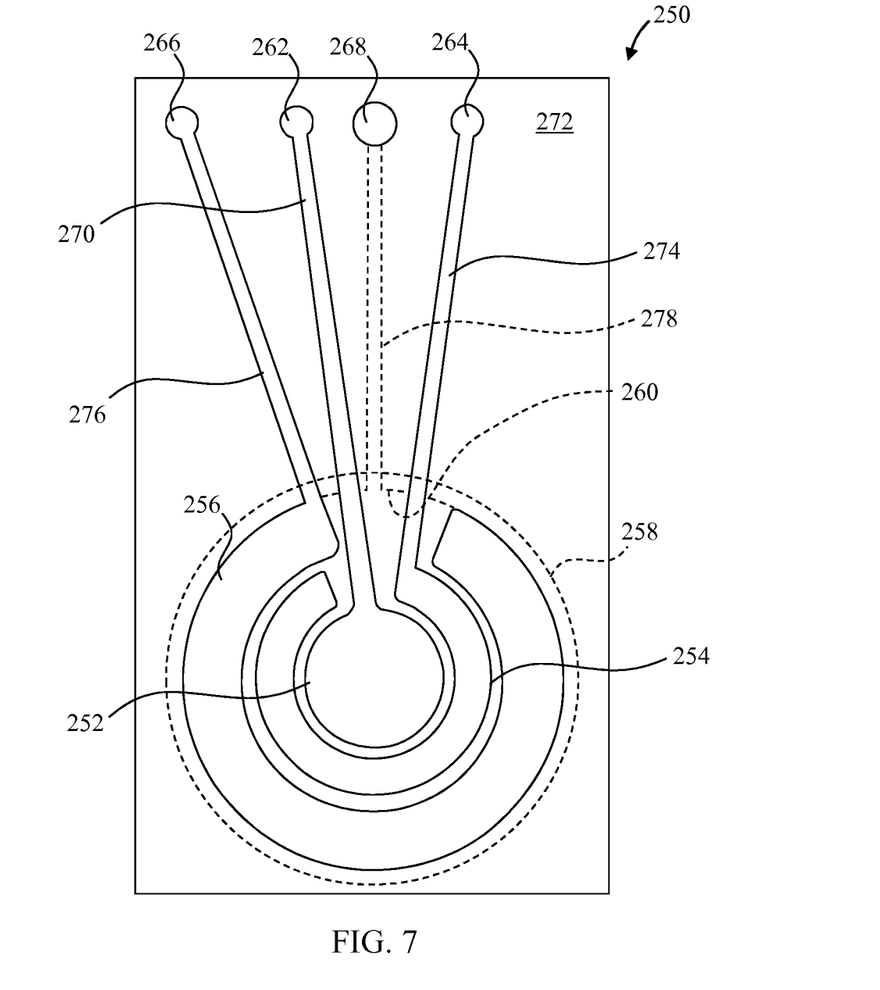
FIG. 7 depicts a top plan view of the membrane portion of a sensor device including three electrodes in the flexible membrane.

In other applications, multiple "rings" of electrodes may be desired. FIG. 7 depicts a sensor 250 which includes a central electrode 252, a middle electrode 254, and an outer electrode 256 in a flexible membrane 258. A single fixed electrode 260 is located beneath the electrodes 252, 254, and 256 while in another embodiment three fixed electrodes are provided, each associated with a respective one of the electrodes 252, 254, and 256. The sensor 250 in one embodiment is used to provide for three different ranges of pressure measurements when incorporated in the system 180, each range associated with a respective one of the electrodes 252, 254, and 256 and the fixed electrode 260.

The sensor device 250 furthers includes contacts 262, 264, 266, and 268 electrically coupled to the electrodes 252, 254, 256, and 160, respectively. In one embodiment, the central electrode 252 is in electrical communication with the contact 262 through a lead line 270 which extends along the cap layer 272. The middle and outer electrodes 254, 256 are in electrical communication with the contacts 264, 266 through lead lines 274, 276, respectively, which also extend along the cap layer 272. The fixed electrode 260 is in electrical communication with the contact 268 through the lead line 278.

Advantageously, the above described sensors can be fabricated using known techniques. A process which illustrates the manner in which a sensor similar to those discussed above is formed is discussed with reference to FIGS. 8-15.

Figure 8:
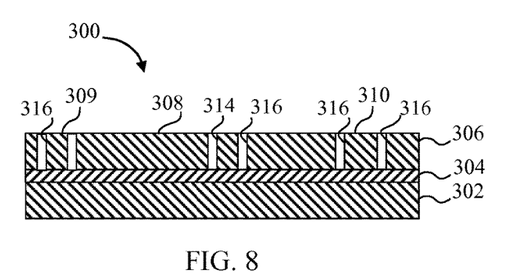
FIG. 8 depicts a side cross-sectional view of a wafer with a device layer etched to define two in-plane-electrodes.
Figure 9:
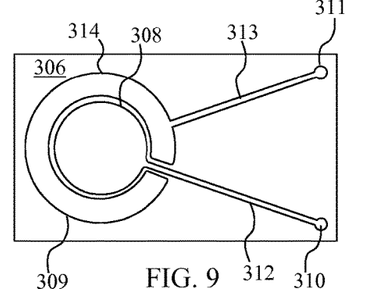
FIG. 9 depicts a top plan view of the wafer of FIG. 8.

Referring initially to FIGS. 8 and 9, an SOI wafer 300 including a handle layer 302, a buried oxide layer 304, and a device layer 306 is initially etched to define two in-plane electrodes 308/309 and lower contact portions 310/311 for the in-plane-electrodes 308/309, respectively. Connectors 312/313 are etched between the in-plane electrodes 308/309 and the lower contact portions 310/311. The in-plane electrode 308 is defined by a trench portion 314, while the in-plane electrode 309 is defined by a trench portion 316. If desired, the structural or handle layer 302 may be a low pressure chemical vapor deposition (LPCVD) or epi-polysilicon layer.

Figure 10:
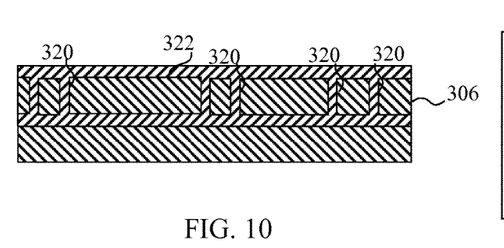
FIG. 10 depicts the wafer of FIG. 8 with the trenches filled with an oxide material and an oxide layer formed above the device layer.
Figure 11:
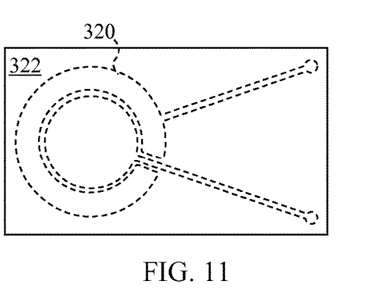
FIG. 11 depicts a top plan view of the wafer of FIG. 10.

The trenches defining the in-plane electrodes 308/309, lower contact portions 310/311, and connectors 312/313 are then filled with a trench oxide portion 320 as shown in FIGS. 10 and 11 using a conformal oxide deposition. Oxide deposition further results in an oxide layer 322 on the upper surface of the device layer 306. The thickness of the oxide layer 322 sets the gap between two electrodes as discussed more fully below. The oxide layer 322 may be planarized by any desired technique such as chemical mechanical polishing (CMP). The oxide layer 322 in some embodiments is realized by a separate oxide deposition, for example.

Figure 12:
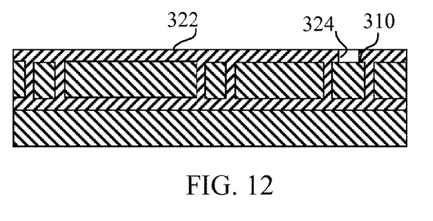
FIG. 12 depicts the wafer of FIG. 10 with an opening etched in the oxide layer above a contact portion of the device layer.
Figure 13:
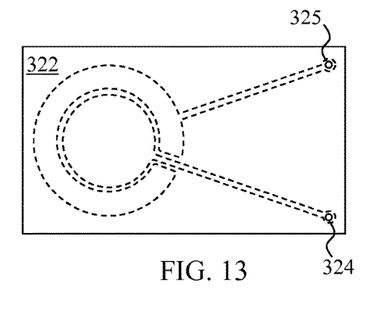
FIG. 13 depicts a top plan view of the wafer of FIG. 12.
Figure 14:
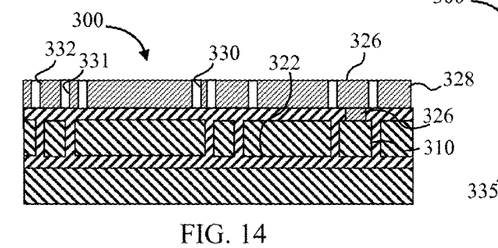
FIG. 14 depicts the wafer of FIG. 12 with a first cap layer portion formed above the oxide layer and trenches formed in the oxide layer to define two out-of-plane electrodes directly above the two in-plane electrodes.
Figure 15:
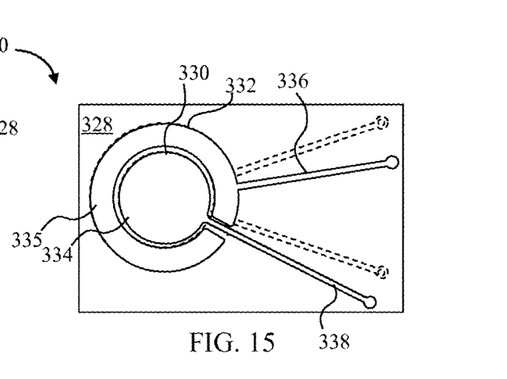
FIG. 15 depicts a top plan view of the wafer of FIG. 14.

Referring to FIGS. 12 and 13, contact openings 324/325 are then etched through the oxide layer 322 to expose the upper surface of the lower contact portions 310/311. An epi-poly deposition fills the contact openings 324/325 with a contact portion 326 of epi-poly while depositing a lower cap layer portion 328 above the oxide layer 322 as shown in FIGS. 14 and 15. The contact portion 326 thus extends from the upper surface of the lower contact portion 310 to the upper surface of the lower cap layer portion 328. In an alternative embodiment, the lower cap layer portion 328 may be a single crystal silicon formed using a fusion bonding process followed by grinding/polishing or Smart-Cut technology to remove the bulk of the bonded wafer. In this alternative embodiment, electrical contacts must be formed after fusion. In a further embodiment, a polished polysilicon device layer may be used.

FIGS. 14 and 15 further show trenches 330 and 332 which may be etched after CMP of the lower cap layer portion 328. The trench 330 extends from the upper surface of the lower cap layer portion 328 to the upper surface of the oxide layer 322 to define an electrode 334. The trench 330 includes a trench portion that defines a connector 338. The trench 332 defines an outer electrode 335, and a trench portion defines a connector 336.

In some embodiments, a low stress nitride is then used to fill the trenches 332 and 330 and form a low stress nitride layer on the upper surface of the lower cap layer portion 328. A thin oxide layer is then provided on the upper surface of the low stress nitride layer. The thin oxide layer and the nitride layer are then patterned and etched to form a gasket about the two electrodes 334 and 335.

A thin epi-poly deposition layer is then formed on the upper surface of the lower cap portion 328 and the upper surface of the gaskets to form a middle cap layer portion. The middle cap layer portion may be planarized if desired.

After vent holes are formed, an HF vapor etch release is performed which releases the electrodes 334/335. The etched portion of the oxide layer 322 between the upper surface of the in-plane-electrodes 308/309 and the lower surface of the electrodes 334/335 sets the gap between the in-plane-electrodes 308/309 and the lower surface of the out-of-plane electrodes 334/335. A clean high temperature seal is then performed in an epi reactor to seal the vent holes. Alternatively, the vent holes may be sealed using oxide, nitride, silicon migration, etc.

Additional trenching/etching operations are performed in different embodiments to provide the desired final device configuration. Accordingly, by slight modification of the process of FIGS. 8-15 for the particular arrangement of electrodes, each of the sensors in FIGS. 1-3 and 5-7 is formed. While one method of fabricating the disclosed structures has been described, other methods may be used.

The above described sensors incorporate multiple sense electrodes in the sensor membrane and/or the fixed electrode region. The incorporation of these additional electrodes add several advantages such as matched temperature effects of variable and reference capacitors, separate electrodes for electrostatic testing, possibilities for improved linearity, and capability for increased dynamic range of the sensor.

The multiple electrodes are mechanically well coupled, while being electrically insulated.

Consequently, the above described devices can be used to provide a capacitive sensor with multiple isolated electrodes in a membrane and/or fixed electrode. In different embodiments, the device is configured as a single, common fixed electrode using multiple membrane electrodes, and as a single, common membrane electrode using multiple fixed electrodes.

In some embodiments, the electrodes are formed from dielectric-filled insulating trenches (membrane or fixed electrodes), from deposited metal on top of an insulating layer, or from dopant implant in silicon (membrane or fixed electrodes).

In some embodiments, the electrodes include a central electrode with one or more concentric outer electrodes. In some embodiments, the electrodes include a set of central electrodes (e.g., a circle divided into smaller regions) with concentric outer electrodes (also divided into smaller regions). In some embodiments, the electrodes are arbitrarily-shaped and located according to some need (mode shape, layout complexity, etc.). In some embodiments, the electrodes are serpentine or interdigitated electrodes for increased fringe capacitance.

While the invention has been illustrated and described in detail in the drawings and foregoing description, the same should be considered as illustrative and not restrictive in character. Numerous variations to the above approaches may, for example, include performing the above steps in a different order are possible. It is understood that only the preferred embodiments have been presented and that all changes, modifications and further applications that come within the spirit of the invention are desired to be protected.

The invention claimed is:

1. A MEMS sensor comprising:
a substrate layer;
a first fixed electrode defined in the substrate layer;
a second fixed electrode;
a cavity defined above the first fixed electrode;
a membrane extending over the cavity and supported by the substrate layer;
a first movable electrode defined in the membrane and located substantially directly above the first fixed electrode; and
a second movable electrode defined at least partially within the membrane and located at least partially directly above the cavity and the second fixed electrode, wherein no portion of the second movable electrode is located directly above the first fixed electrode.

2. The MEMS sensor of claim 1, wherein the first movable electrode and the second movable electrode are concentric.

3. The MEMS sensor of claim 2, wherein:
the second fixed electrode is defined in the substrate layer;
no portion of the first movable electrode is located directly above the second fixed electrode; and
a lead line extends from the first movable electrode directly over a portion of the second fixed electrode.

4. The MEMS sensor of claim 2, further comprising:
a third movable electrode defined in the membrane and located directly above the cavity, wherein no portion of the third movable electrode is not located directly above the first fixed electrode or the second fixed electrode.

5. The MEMS sensor of claim 4, further comprising:
a third fixed electrode defined in the substrate layer and directly beneath the third movable electrode.

6. The MEMS sensor of claim 1, wherein the first movable electrode and the second movable electrode are interdigitated.

7. The MEMS sensor of claim 1, wherein:
the first movable electrode is located in a central portion of the membrane;
the second movable electrode is located in an outer portion of the membrane; and
the outer portion of the membrane surrounds the inner portion of the membrane.

8. The MEMS sensor of claim 7, further comprising:
a third movable electrode located in the central portion of the membrane; and
a fourth movable electrode located in the outer portion of the membrane.

9. The MEMS sensor of claim 8, further comprising:
a fifth movable electrode located in the central portion of the membrane;
a sixth movable electrode located in the central portion of the membrane;
a seventh movable electrode located in the outer portion of the membrane; and
an eighth movable electrode located in the outer portion of the membrane.

10. A method of forming a MEMS sensor comprising:
forming a first fixed electrode in a first layer;
forming a second fixed electrode in the first layer;
forming a membrane layer above the first layer such that the first layer supports the membrane layer;
forming a first movable electrode in the formed membrane layer and located substantially directly above the formed first fixed electrode;
forming a second movable electrode in the membrane layer at a location at least partially directly above the formed second fixed electrode, wherein no portion of the second movable electrode is located directly above the first fixed electrode; and
forming a cavity between the first layer and the membrane layer, the cavity extending beneath the first movable electrode and at least partially beneath the second movable electrode.

11. The method of claim 10, wherein the first movable electrode and the second movable electrode are formed concentrically.

12. The method of claim 11, wherein forming the second fixed electrode comprises:
forming the second fixed electrode in the first layer at the same time as the first electrode is formed.

13. The method of claim 11, further comprising:
forming a third movable electrode in the membrane layer at a location such that no portion of the third moveable electrode is directly above the first fixed electrode or the second fixed electrode, wherein forming the cavity further comprises forming the cavity beneath the third movable electrode.

14. The method of claim 13, further comprising:
forming a third fixed electrode in the first layer such that the third movable electrode is directly above the third movable electrode.

15. The method of claim 10, wherein forming the first movable electrode and forming the second moveable electrode comprises forming interdigitated first and second movable electrodes.

16. The method of claim 10, wherein:
forming the first movable electrode comprises forming the first movable electrode in a central portion of the membrane layer such that no portion of the first movable electrode is located directly above the second fixed electrode, and with a lead line extending from the first moveable electrode and over a portion of the second fixed electrode;
forming the second movable electrode comprises forming the second movable electrode in an outer portion of the membrane layer; and
the outer portion of the membrane layer surrounds the inner portion of the membrane layer.

17. The method of claim 16, further comprising:
forming a third movable electrode in the central portion of the membrane layer; and
forming a fourth movable electrode in the outer portion of the membrane layer.

18. The MEMS sensor of claim 17, further comprising:
forming a fifth movable electrode in the central portion of the membrane layer;
forming a sixth movable electrode in the central portion of the membrane layer;
forming a seventh movable electrode in the outer portion of the membrane layer; and
forming an eighth movable electrode in the outer portion of the membrane layer.

19. A MEMS pressure system comprising:
a MEMS sensor including
 a first fixed electrode in a first layer,
 a second fixed electrode in the first layer,
 a cavity defined above the first fixed electrode and the second fixed electrode,
 a membrane extending over the cavity,
 a first movable electrode defined in the membrane and located substantially directly above the first fixed electrode, and
 a second movable electrode defined at least partially within the membrane and located at least partially directly above the second fixed electrode, wherein no portion of the second movable electrode is directly above the first fixed electrode;
a memory including program instructions stored therein; and
a processor operably connected to the MEMS sensor and the memory and configured to execute the program instructions to
 obtain a first signal from the MEMS sensor using the first movable electrode,
 obtaining a second signal from the MEMS sensor using the second movable electrode, and
 determine a pressure based upon the first signal and the second signal.

20. The MEMS pressure system of claim 19, wherein no portion of the first movable electrode is located directly above the second fixed electrode, the MEMS pressure system further comprising:
a lead line extending from the first movable electrode directly over a portion of the second fixed electrode.

* * * * *

UNITED STATES PATENT AND TRADEMARK OFFICE
CERTIFICATE OF CORRECTION

PATENT NO.         : 10,183,857 B2
APPLICATION NO.    : 13/969840
DATED              : January 22, 2019
INVENTOR(S)        : Graham et al.

It is certified that error appears in the above-identified patent and that said Letters Patent is hereby corrected as shown below:

In the Claims

In Column 7, Lines 51-52, Lines 3-4 of Claim 4 should read:
located directly above the cavity, wherein no portion of
the third movable electrode is located directly Signed and Sealed this
Sixteenth Day of April, 2019

Andrei Iancu
*Director of the United States Patent and Trademark Office*